US006892446B2

United States Patent
Hwang et al.

(10) Patent No.: US 6,892,446 B2
(45) Date of Patent: May 17, 2005

(54) SURFACE MOUNTING DEVICE WITH MOVABLE CONVEYORS

(75) Inventors: Ji Hyun Hwang, Kyungki-do (KR); Do Hyun Kim, Kyoungki-do (KR)

(73) Assignee: Mirae Corporation, Chunan-si (KR)

( * ) Notice: Subject to any disclaimer, the term of this patent is extended or adjusted under 35 U.S.C. 154(b) by 410 days.

(21) Appl. No.: 09/987,752

(22) Filed: Nov. 15, 2001

(65) Prior Publication Data

US 2002/0062554 A1 May 30, 2002

(30) Foreign Application Priority Data

Nov. 24, 2000 (KR) ........................................ 2000-70456

(51) Int. Cl.⁷ ................................................ H05K 3/30
(52) U.S. Cl. ............................ 29/740; 29/739; 29/743; 29/832; 198/346.1; 198/465.1; 414/222
(58) Field of Search ........................ 29/739, 740, 832, 29/743, 426.3; 198/346.1, 346.2, 465.1, 465.2, 465.3, 487.1; 414/222

(56) References Cited

U.S. PATENT DOCUMENTS

| 4,708,232 A | * | 11/1987 | Hata et al. ................ 198/346.1 |
| 5,778,524 A | | 7/1998 | Stridsberg .................... 29/836 |
| 6,526,651 B1 | * | 3/2003 | Hwang ........................ 29/740 |
| 6,590,355 B1 | * | 7/2003 | Kikuchi et al. ............. 318/135 |

* cited by examiner

Primary Examiner—Richard Chang
(74) Attorney, Agent, or Firm—Fleshner & Kim, LLP

(57) ABSTRACT

The surface mounting method includes: transferring the PCB to one conveyer among multiple conveyers capable of moving from a first transfer; transferring the PCB to another conveyer; transferring the PCB to one conveyer, while electronic parts from a parts feeder are mounted onto the transferred PCB; mounting the electronic parts from the parts feeder again onto the transferred PCB, while the PCB onto which the parts have been mounted is transferred to the second transfer; and transferring the PCB onto which the parts have been mounted again to the second transfer, while a new PCB is transferred to one conveyer of the conveyers from the first transfer.

21 Claims, 8 Drawing Sheets

SURFACE MOUNTING DEVICE WITH MOVABLE CONVEYORS

BACKGROUND OF THE INVENTION

1. Field of the Invention

The present invention relates to a surface mounting device and the method thereof capable of simultaneous process on a plurality of printed circuit boards, and more particularly, to a surface mounting device and the method thereof capable of simultaneously picking and placing electronic parts on a plurality of printed circuit boards using a transfer and a conveyer that are movable.

2. Description of the Related Art

Generally, a surface mounting device includes a base frame, an X-Y gantry, a head unit, a printed circuit board carrier, and a parts feeder. The X-Y gantry is installed on the base frame to be moved in an X-Y axis direction of the head unit. The head unit is installed at the X-Y gantry to mount parts fed by the parts feeder on the printed circuit board while moving. The printed circuit board having the parts mounted thereon is carried to a parts mounting work position by the printed circuit board carrier.

The construction of the surface mounting device for mounting parts on the printed circuit board carried to the parts mounting work position will now be described in detail with reference to the accompanying drawings. FIG. 1 is a perspective view of a conventional surface mounting device. As illustrated therein, the surface mounting device 10 includes a base frame 11, an X-Y gantry 12, first and second head units 13 and 14, a printed circuit board carrier 15, and a parts feeder 16. The base frame 11 is used for supporting the full load of the surface mounting device 10. The X-Y gantry 12 is installed on a plane of the base frame 11.

The X-Y gantry 12 includes an Y-axis stator frame 12a, a plurality of Y-axis permanent magnets 12b, an Y-axis mover 12c, an X-axis stator frame 12d, a plurality of X-axis permanent magnets 12e, and an X-axis mover 12f. The plurality of Y-axis permanent magnets 12b consisting of N and S poles are installed on an inner sidewall of the Y-axis stator frame 12a, and the plurality of X-axis permanent magnets 12e consisting of N and S poles are installed on an inner sidewall of the X-axis stator frame 12d. The Y-axis mover 12c is installed inside the Y-axis stator frame 12a at which the Y-axis permanent magnets 12b are installed, and the X-axis mover 12f is installed inside the X-axis stator frame 12d.

On a plane of the X-axis mover 12f, the first head unit 13 is installed. When an electric signal is supplied to a plurality of armature coils (not shown) installed at the X-axis mover 12f, the first head unit 13 moves in an X-axis direction by a thrust force generated between the armature coils and the X-axis permanent magnets 12e. To move the first head unit 13 in an Y-axis direction, the X-axis stator frame 12d is moved in the Y-axis direction.

To move the X-axis stator frame 12d in the Y-axis direction, the X-axis stator frame 12d is formed integrally with the Y-axis mover 12c. The Y-axis mover 12c having the X-axis stator frame 12d formed integrally is installed inside the Y-axis stator frame 12a. When an electric signal is supplied to a plurality of armature coils (not shown) installed at the Y-axis mover 12c, a thrust force is generated between the armature coils and the Y-axis permanent magnets 12b. By this thrust force, the Y-axis mover 12c is moved in the Y-axis direction.

As the Y-axis mover 12c moves, the X-axis stator frame 12d formed integrally with the Y-axis mover 12c moves in the Y-axis direction and thusly the first head unit 13 moves in the Y-axis direction. The second head unit 14 moves in the X-Y axis direction in the same way as the first head unit 13. The first head unit 13 and the second head unit 14 moving in the X-Y axis direction mount parts on the printed circuit board carried by the printed circuit board carrier 15.

To mount parts on the printed circuit board using the first head unit 13 and the second head unit 14, firstly, the first head unit 13 and the second head unit 14 suck parts. The parts are mounted at the parts feeder 16 in a tape reel (not shown) state. When the parts are separated from the tape reel mounted at the parts feeder 16, the first head unit 13 and the second head unit 14 suck the parts and then the parts are mounted on the printed circuit board 1. The printed circuit board 1 having the parts mounted will now be described with reference to the accompanying drawings.

As illustrated in FIG. 2, the printed circuit board carrier 15 includes a base frame 15a, first and second guide frames 15b and 15c, a width adjusting screw 15d, a plurality of lifting members 15e, a stopper 15f, a stopper roller 15g, and a width adjusting screw 15h. The first guide frame 15b and the second guide frame 15c are installed at both side of the base frame 15a. The width adjusting screw 15d is installed between the first guide frame 15b and the second guide frame 15c. The width adjusting screw 15h is installed at a position at a predetermined distance from the width adjusting screw 15d.

The stopper 15f installed at the stopper roller 15g is disposed at one side of the width adjusting screw 15h, and the plurality of lifting members 15e are provided between the width adjusting screw 15d and the width adjusting screw 15h. The printed circuit board carrier 15 carries the printed circuit board 1 to a parts mounting work position (a). When the printed circuit board 1 is carried to the parts mounting work position (a) by the stopper 15f, the position is fixed by the lifting member 15e. Afterwards, the mounting of parts is finished, the printed circuit board 1 is discharged.

As described above, since the conventional surface mounting device having a printed circuit board carrier is constructed in a single structure, it can mount parts carried by a plurality of head units on only one printed circuit board, and thusly the productivity of the mounting work cannot be improved.

SUMMARY OF THE INVENTION

It is, therefore, an object of the present invention to provide a surface mounting device and the method thereof capable of simultaneous mounting parts on two or more printed circuit boards.

It is another object of the present invention to provide a surface mounting device and the method thereof capable of simultaneous mounting parts on a plurality of printed circuit boards, thereby improving the productivity of the parts mounting work.

To achieve the above object, there is provided a surface mounting device including an X-Y gantry mounted on a base frame, a plurality of head units mounted on predetermined positions of the X-Y gantry, a parts feeder for supplying parts mounted on a printed circuit board carried to a parts mounting work position, the surface mounting device comprising: a plurality of transfers movably mounted on both sides of the base frame in parallel with each other; a driving means for moving the plurality of transfers; a plurality of movable conveyers in X and Y directions mounted between the plurality of transfers; and a plane power transmission device for generating a driving force for moving the plurality of conveyers into X and Y directions.

In addition, there is provided a surface mounting method for mounting parts on a printed circuit board, the surface mounting method comprising the steps of: transferring the printed circuit board to one conveyer among a plurality of conveyers capable of moving from a first transfer with a predetermined direction; transferring the printed circuit board to another conveyer among the plurality of conveyers; transferring the printed circuit board to one conveyer of the plurality of conveyers, while electronic parts from a parts feeder are mounted onto the transferred printed circuit board; mounting the electronic parts from the parts feeder again onto the transferred printed circuit board, while the first printed circuit board onto which the parts have been mounted is transferred to the second transfer; and transferring the printed circuit board onto which the parts have been mounted again to the second transfer, while a new printed circuit board is transferred to one conveyer of the plurality of conveyers from the first transfer.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will now be described with reference to the accompanying drawings.

Figure 1:
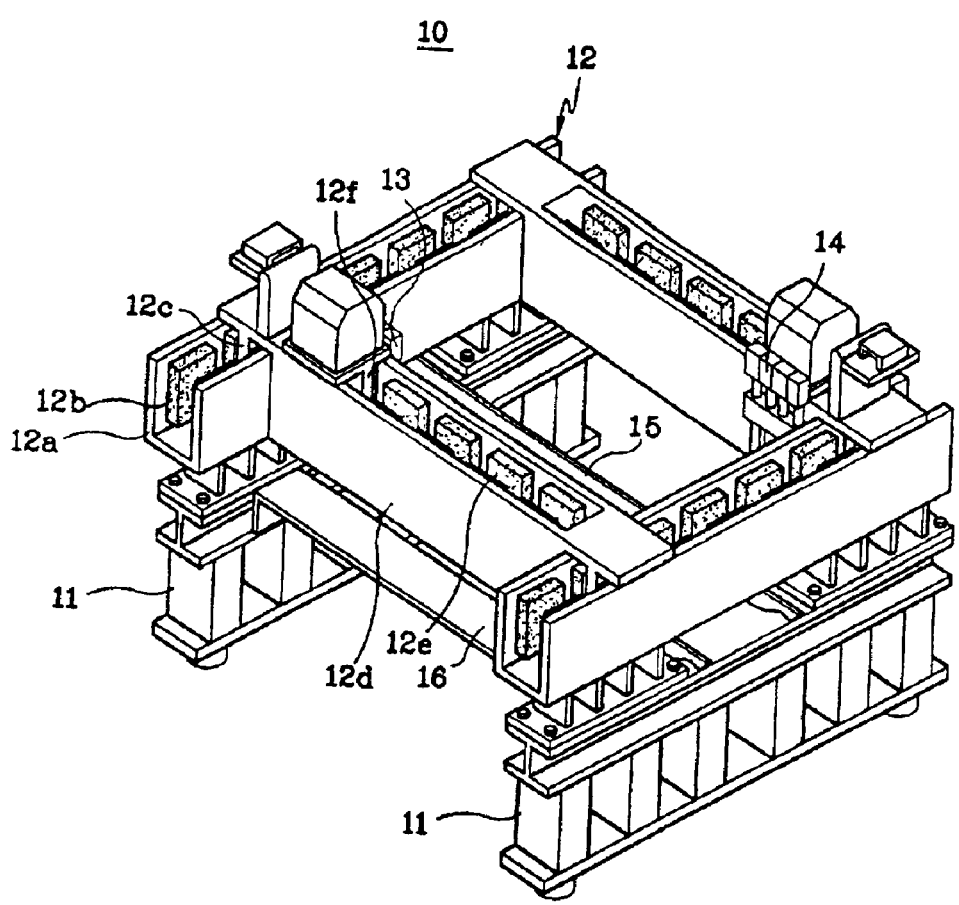
FIG. 1 is a perspective view of a surface mounting device according to the conventional art.
Figure 2:
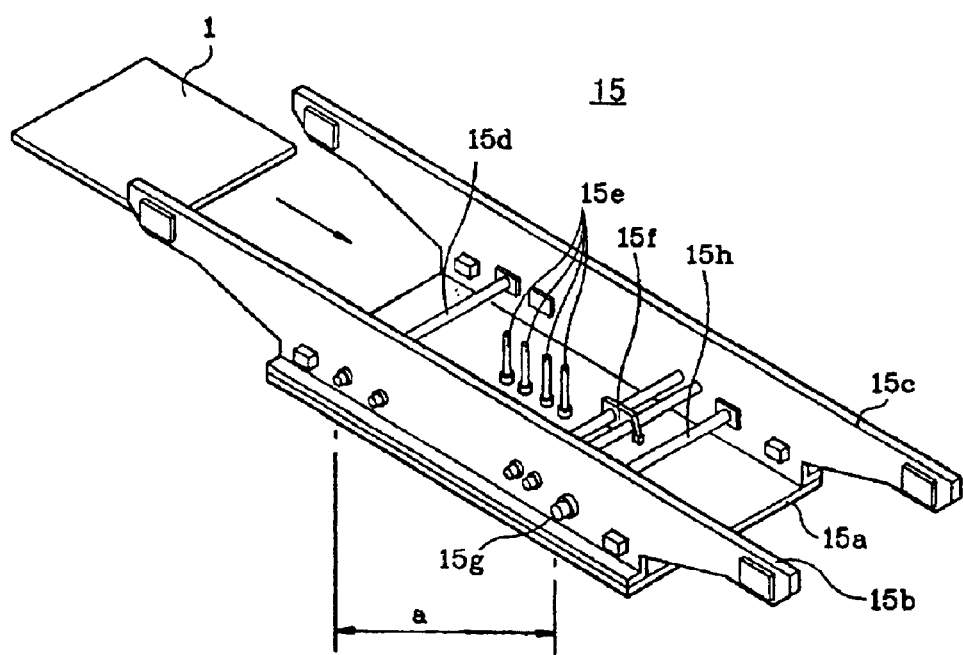
FIG. 2 is a perspective view of a conveyer as illustrated in FIG. 1.
Figure 3:
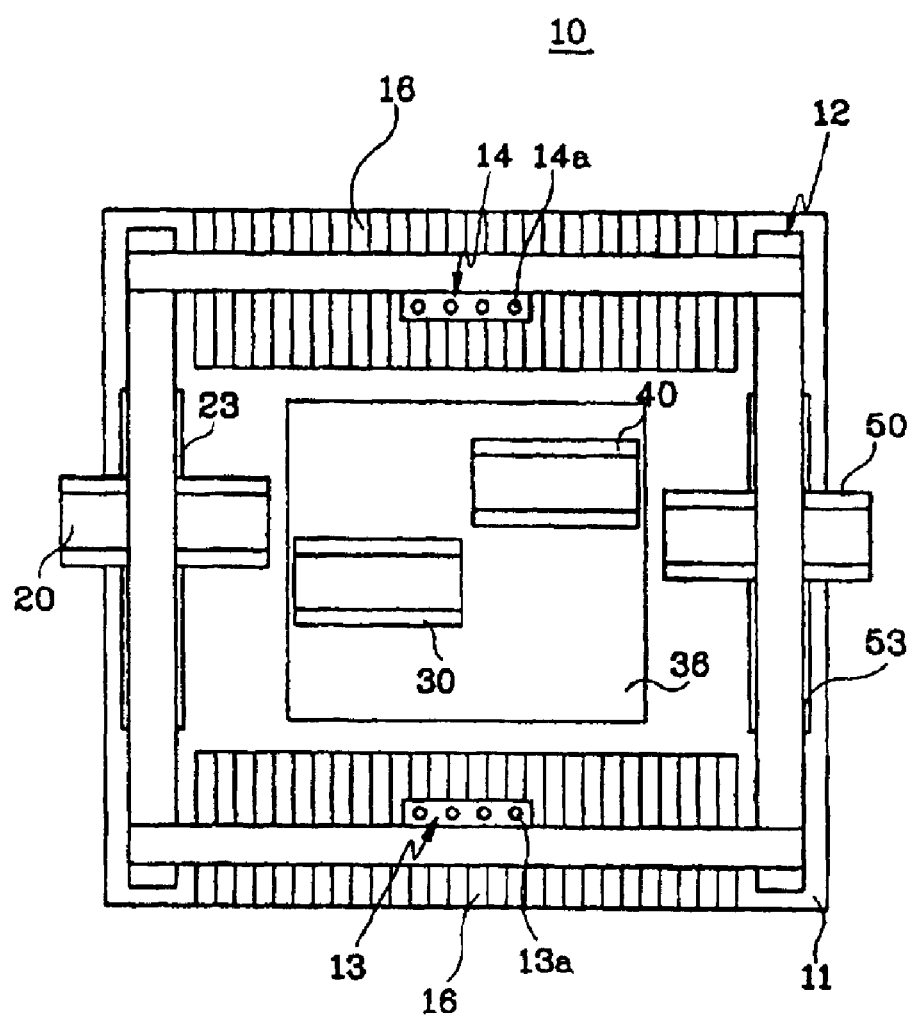
FIG. 3 is a plane view of a surface mounting device to which a printed circuit board carrier is adapted according to the present invention.
Figure 4A:
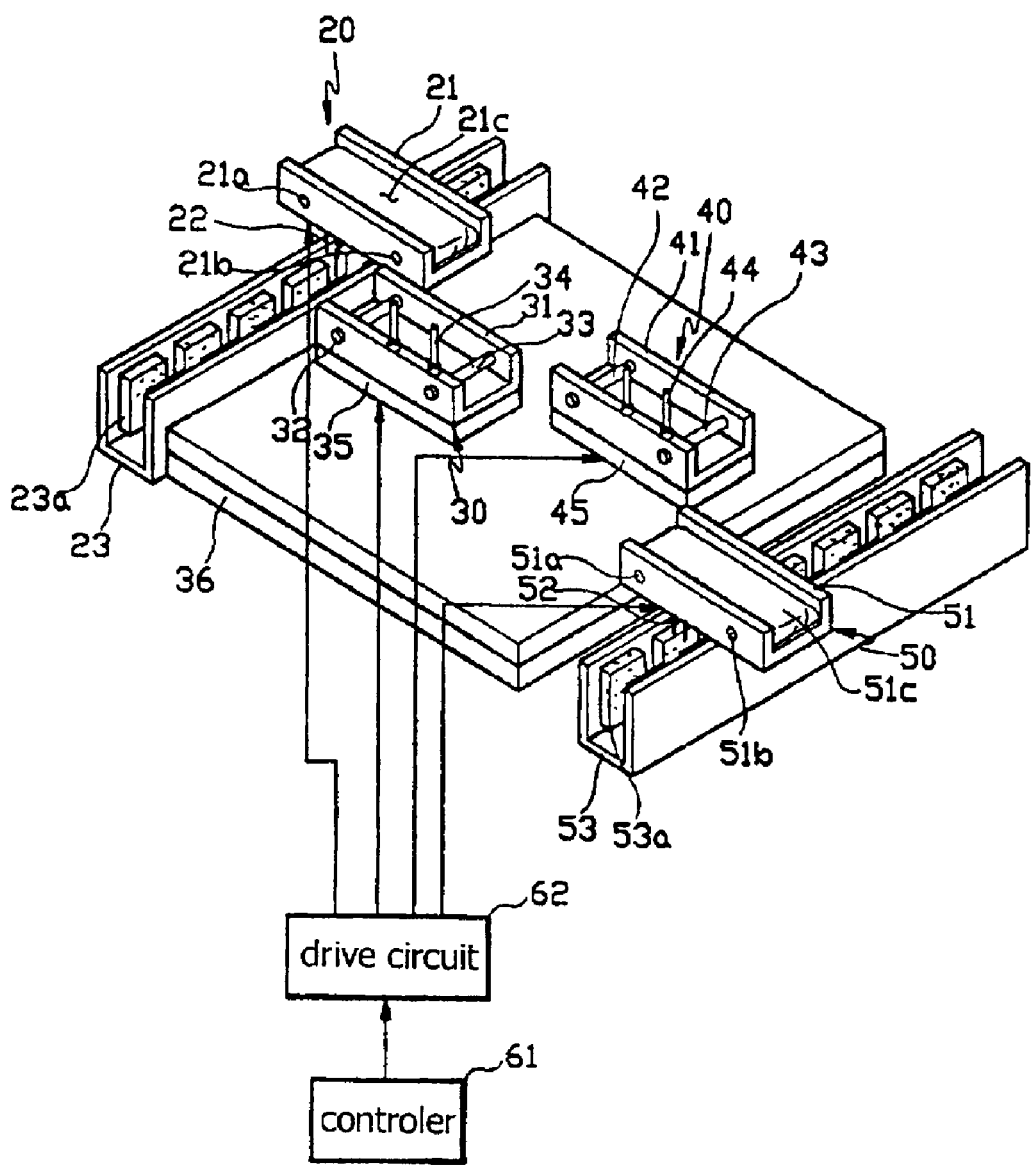
FIGS. 4a and 4b are perspective views of the surface mounting device to which a moving coil type linear motor and a moving magnet type linear motor are adapted respectively according to the present invention.
Figure 4B:
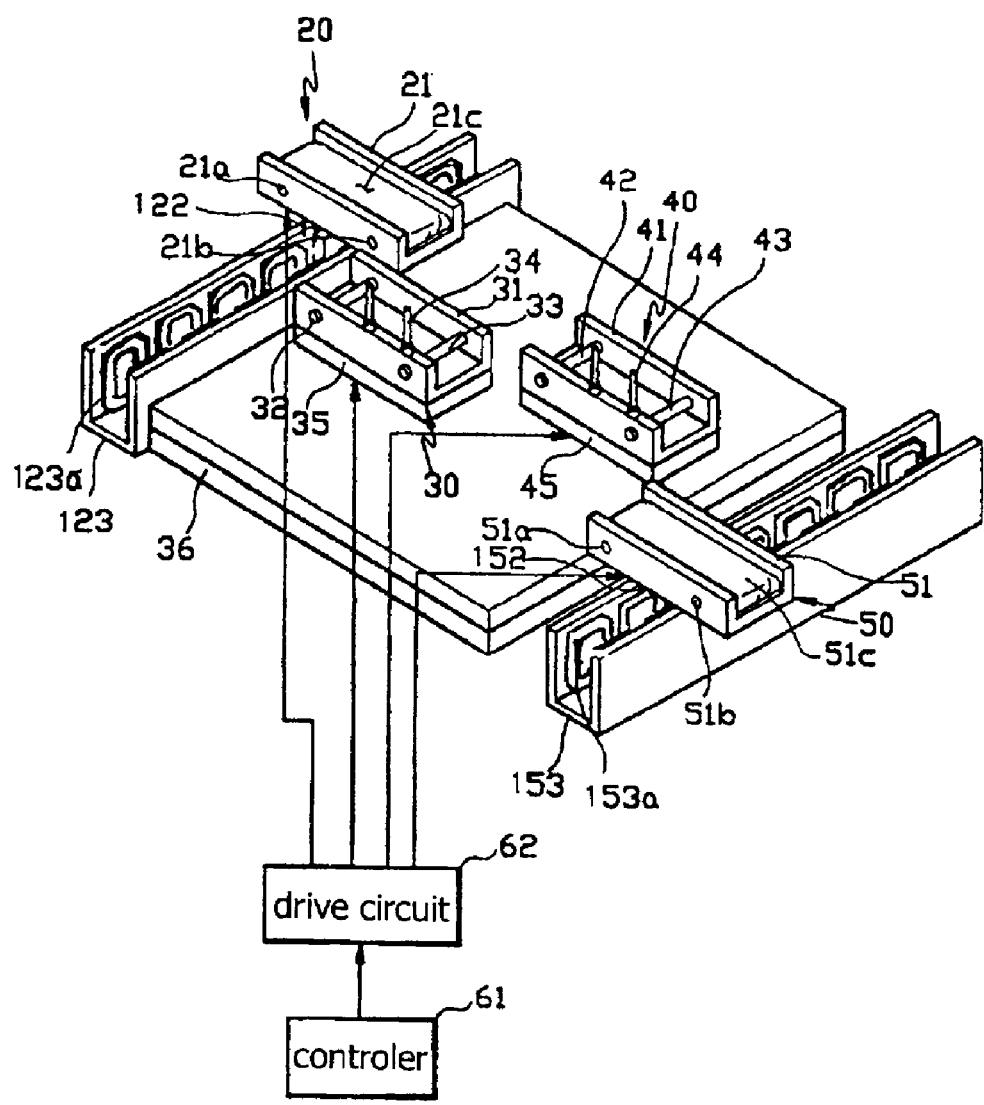

FIG. 3 is a plane view of a surface mounting device to which a printed circuit board carrier is adapted according to the present invention. FIGS. 4a and 4b are perspective views of the surface mounting device to which a moving coil type linear motor and a moving magnet type linear motor are adapted respectively according to the present invention.

The surface mounting device of the present invention includes: a first transfer 20 moved in an Y-axis direction for carrying a stored printed circuit board 1; a first conveyer 30 moved to an X-Y axis plane for carrying the printed circuit board 1 carried from the first transfer 20 to a parts mounting work position and discharging the printed circuit board onto which parts have been mounted; a second conveyer 40 moved to the X-Y axis plane for selectively receiving and carrying the printed circuit board 1 carried from the first transfer 20 and the printed circuit board 1 carried from the first conveyer 30 to a parts mounting work position and discharging the printed circuit board onto which parts have been mounted; a plane power transmission device provided with first and second plane movers 35 and 45 and a plane stator frame 36 in order to generate a moving force for moving the first conveyer 30 and the second conveyer 40 in an X-Y axis direction; a second transfer 50 moved in the Y-axis direction for selectively receiving and discharging the printed circuit board 1 discharged from the first conveyer 30 and the second conveyer 40; and first and second linear motors installed at the bottom of the first transfer 20 and the second transfer 50 for moving the first transfer 20 and the second transfer 50 in the Y-axis direction.

The construction and operation of the surface mounting device of the present invention will now be described in more detail.

In the surface mounting device 10, as illustrated in FIG. 3, an X-Y gantry 12 is installed on a base frame 11, the first and second head units 13 and 14 each having nozzles 13a and 14a are installed at the X-Y gantry 12, and a plurality of parts feeder 16 on which a tape reel (not shown) and the like are to be mounted is mounted at the bottom of the X-Y gantry 12. Between the base frame 11 at which the X-Y gantry 12 is installed and the X-Y gantry 12, the first transfer 20, the first conveyer 30, the second conveyer 40, and the second transfer 50 are installed.

The first transfer 20 carrying the printed circuit board 1 to a parts mounting work position is installed to be moved in the Y-axis direction. The first transfer 20 moves in the Y-axis direction and carries the printed circuit board to the first conveyer 30 or the second conveyer 40. The first conveyer 30 to which the printed circuit board has been carried carries the carried printed circuit board 1 to the parts mounting work position, and then carries the printed circuit board 1 to the second transfer 50 when the mounting of parts is finished.

The first conveyer 30 and the second conveyer 40 that has selectively received the printed circuit board 1 from the first transfer 20 carry the carried printed circuit board 1 to the parts mounting work position, and then carries the printed circuit board 1 to the second transfer 50 when the mounting of parts is finished. Here, parts are simultaneously fed from the plurality of parts feeder 16 installed at a predetermined portion of the surface mounting device 10 and are mounted onto the printed circuit board 1 carried to the first conveyer 30 and the second conveyer 40.

The first conveyer 30 carrying the printed circuit board carried from the first transfer to the parts mounting work position is installed on the plane stator frame 36 fixedly installed at the center of the base frame 11 so that it can be moved in the X-Y direction. The printed circuit board 1 discharged from the first conveyer 30 that is installed to be moved in the X-Y direction is carried to the second conveyer 40 or to the second transfer 50. Like the first conveyer 30, the second conveyer 40 is installed on the plane stator frame 36 so that it can be moved in the X-Y direction.

The second conveyer 40 installed on the plane stator frame 36 to be moved in the X-Y direction receives the printed circuit board 1 selectively carried from the first transfer 20 or the first conveyer 30, carries the same to the parts mounting work position, and then discharges the printed circuit board 1 when the mounting of parts is finished. The printed circuit board 1 discharged from the first conveyer 30 or the second conveyer 40 is carried to the second transfer 50. The second transfer 50 that has received the printed circuit board 1 discharged from the first conveyer 30 or the second conveyer 40 is installed so that it can be moved in the Y-axis direction as the first transfer 20.

The second transfer 50 receives the printed circuit board 1 carried from the first conveyer 30 or the second conveyer 40 and discharges the printed circuit board 1 onto which parts have been mounted. The first transfer 20, first conveyer 30, second conveyer 40, and second transfer 50 will now be described in more detail, which carry the printed circuit board 1 to the parts mounting work position and discharges the printed circuit board 1 onto which parts have been mounted.

The first transfer 20 includes a first transfer base frame 21, a plurality of first transfer rollers 21a and 21b, a first belt member 21c, and a first linear motor. Here, the first linear motor includes a first armature coil unit 22 and a first transfer stator frame 23. The first transfer base frame 21 of the first transfer 20 carried in the Y-axis direction guides the printed circuit board 1 when carrying the printed circuit board 1, has the plurality of first transfer rollers 21a and 21b installed at a sidewall at a predetermined interval, and the first armature coil unit 22 of the first linear motor is installed at the center of the bottom.

As illustrated in FIG. 4a, the first armature coil unit 22 installed at the bottom of the first transfer base frame 21 is installed inside the first transfer stator frame 23, and a plurality of permanent magnets 23a are installed at an inner sidewall of the first transfer stator frame 23. When an electric signal is supplied to the first armature coil unit 22 installed inside the first transfer stator frame 23 at which the plurality of permanent magnets 23a are installed, there is generated a thrust force for carrying the first armature coil unit 22 between the permanent magnets 23a. By this thrust force, the first armature coil unit 22 is guided and moved to the first transfer stator frame 23 installed in the Y-axis direction. In FIG. 4a, a moving coil type linear motor is used, which includes the stator frame 23 having the plurality of permanent magnets 23a installed at its inner sidewall and the first armature coil unit 22. In place of the moving coil type linear motor, as illustrated in FIG. 4b, a moving magnet type linear motor can be used, which includes a stator frame 123 having a third armature coil unit 123a formed of a plurality of coils installed on its inner sidewall and a plurality of permanent magnets 122.

On an inner sidewall of the first transfer base frame 21 guided to the first transfer stator frame 23 installed in the Y-axis direction and moved in the Y-axis direction, the plurality of first transfer rollers 21a and 21b are installed. The plurality of first transfer rollers 21a and 21b are rotated in a predetermined direction when carrying the printed circuit board 1. To carry the printed circuit board 1 to the first conveyer 20 by the rotation of the plurality of first transfer rollers 21a and 21b, the first belt member 21c is installed at the plurality of first transfer rollers 21a and 21b. In a state that the printed circuit board 1 is placed on the first belt member 21c, the first belt member 21c is rotated by the rotation of the plurality of first transfer rollers 21a and 21b for thereby carrying the printed circuit board 1 to the first conveyer 30 or the second conveyer 40.

The printed circuit board 1 carried by the first transfer 20 is carried to a parts mounting work position by the first conveyer 30. The first conveyer 30 carrying the printed circuit board to the parts mounting work position includes a first conveyer base frame 31, a first conveyer transfer roller 32, a first conveyer discharging roller 33, and a first conveyer lifting member 34.

The first conveyer base frame 31 of the first conveyer 30 guides the printed circuit board 1 when carrying the printed circuit board 1, and has the first plane mover 35 of a plane power transmission device installed at the bottom. The plane power transmission device comprises the first plane motor 35, a plane stator frame 36, and a second plane mover 45.

The first plane mover 35 is installed on the plane stator frame 36 fixedly installed at the base frame 11 of the surface mounting device 10 and has a plurality of permanent magnets (not shown) for interaction with the first plane mover 35. Inside the first plane mover 35, an armature coil (not shown) is installed.

When an electric signal is supplied to the first plane mover 35 of the plane power transmission device from the outside, a thrust force is generated between the plurality of permanent magnets installed at the plane stator frame 36 and thusly the first plane mover 35 is moved in the X-Y axis direction. As the first plane mover 35 moves in the X-Y axis direction on the plane stator frame 36, the first conveyer 30 installed at the first plane mover 35 is carried to the first transfer 20, the second conveyer 40 and the second transfer 50.

At one end of both sidewalls of the first conveyer base frame 31 moved in the X-Y axis direction on the plane stator frame 36, the first conveyer transfer roller 32 is installed. The first conveyer transfer roller 32 is rotated for carrying the printed circuit board 1 carried from the first transfer 20 to the parts mounting work position, When the printed circuit board 1 is carried to the parts mounting work position by the rotation of the first conveyer transfer roller 32, it is lifted to a predetermined height by the first conveyer lifting member 34.

When the mounting of parts is finished after the printed circuit board 1 is lifted to the predetermined height by the first conveyer lifting member 34, the printed circuit board 1 is lowered. When the printed circuit board 1 is lowered by the first conveyer lifting member 34, the printed circuit board 1 is contacted to the first conveyer discharging roller 33. The first conveyer discharging roller 33 is installed at the other end of both sidewalls of the first conveyer base frame 31 and carries the lowered printed circuit board 1 to the second conveyer when the printed circuit board 1 is lowered by the first conveyer lifting member 34.

The printed circuit board 1 carried from the first conveyer 30 moved in the X-Y axis direction is directly carried to the second transfer 50 after it is carried to the second conveyer 40. The second conveyer 40 which receives the printed circuit board 1 carried from the first conveyer 30 or directly receives the printed circuit board 1 from the first transfer 20 includes a second conveyer base frame 41, a second conveyer transfer roller 42, a second conveyer discharging roller 43, and a second conveyer lifting member 44.

The second conveyer base frame 41 of the second conveyer 40 guides the printed circuit board 1 when carrying the printed circuit board 1 and has the second plane mover 45 of the plane power transmission device installed at the bottom. The second plane mover 45 is installed on the plane stator frame 36 fixedly installed at the base frame 11 of the surface mounting device 10. Here, an armature coil (not shown) is installed inside the second plane mover 45 for interaction with the plurality of permanent magnets and the second plane mover 45 installed on the plane stator frame 36.

When an electric signal is supplied to the second plane mover 45 of the plane power transmission device from the outside, a thrust force is generated between the plurality of permanent magnets installed at the plane stator frame 36 and thusly the second plane mover 45 is moved in the X-Y axis direction. As the second plane mover 45 moves in the X-Y axis direction on the plane stator frame 36, the second conveyer 40 installed at the second plane mover 45 is carried to the first transfer 20, the first conveyer 30 and the second transfer 50.

The second conveyer base frame 41 carried in the X-Y axis direction on the plane stator frame 36 guides the printed circuit board 1 when carrying the printed circuit board 1. At the same time, the armature coil unit (not shown) is installed at the center of the bottom of the second conveyer base frame 41, and the second conveyer transfer roller 42 is installed at one end of both sidewalls of the second conveyer base frame 41. The second conveyer transfer roller 42 is rotated for carrying the printed circuit board 1 carried from the first conveyer 30 to a parts mounting work position. When the printed circuit board 1 is carried to the parts mounting work position by the rotation of the second conveyer transfer roller 42, it is lifted to a predetermined height by the lifting member 44. Then, the printed circuit board 1 is lowered when the mounting of parts is finished.

When the printed circuit board 1 is lowered, it is carried to the second transfer 50 by the second conveyer discharging roller 43 installed at the other end of both sidewalls of the second conveyer base frame 41. By directly carrying the printed circuit board 1 from the first transfer 20 to the second conveyer 40 and simultaneously mounting parts on the printed circuit board 1 through the first conveyer 30 and the second conveyer 40, the parts mounting speed can be improved and a carrying speed of the printed circuit board 1 can be improved.

The second transfer 50 includes a second transfer base frame 51, a plurality of second transfer rollers 51a and 51b, a second belt member 51c, a second armature coil unit 52, and a second transfer stator frame 53, which has received the printed circuit board selectively carried from the first conveyer 30 and the second conveyer 40. The second transfer base frame 51 of the second transfer 50 carried in the Y-axis direction guides the printed circuit board 1 when carrying the printed circuit board 1, has the plurality of second transfer rollers 51a and 51b installed on a sidewall at a predetermined interval, and has the second armature coil unit 52 installed at the center of the bottom.

The second armature coil unit 52 installed at the bottom of the second transfer base frame 51 is installed inside the second transfer stator frame 53. The second transfer stator frame 53 has a plurality of permanent magnets 53a installed at an inner sidewall. When an electric signal is supplied to the second armature coil unit 52 installed inside the second transfer stator frame 53, a thrust force is generated and thusly the second armature coil unit 52 is guided and moved to the second transfer stator frame 53 installed in the Y-axis direction.

The plurality of second transfer rollers 51a and 51b are installed at a predetermined interval on the sidewalls of the second transfer base frame 51 guided and moved to the second transfer stator frame 53 in the Y-axis direction. The second belt member 51c is installed at the plurality of second transfer rollers 51a and 51b. The second belt member 51c is rotated by the plurality of second transfer rollers 51a and 51b for discharging the printed circuit board 1. In FIG. 4a, a moving coil type linear motor is used, which includes the stator frame 53 having the plurality of permanent magnets 53a installed at its inner sidewall and the second armature coil unit 52. In place of the moving coil type linear motor, as illustrated in FIG. 4b, a moving magnet type linear motor can be used, which includes a stator frame 153 having a fourth armature coil unit 153a formed of a plurality of coils installed on its inner sidewall and a plurality of permanent magnets 152.

Figure 5A:
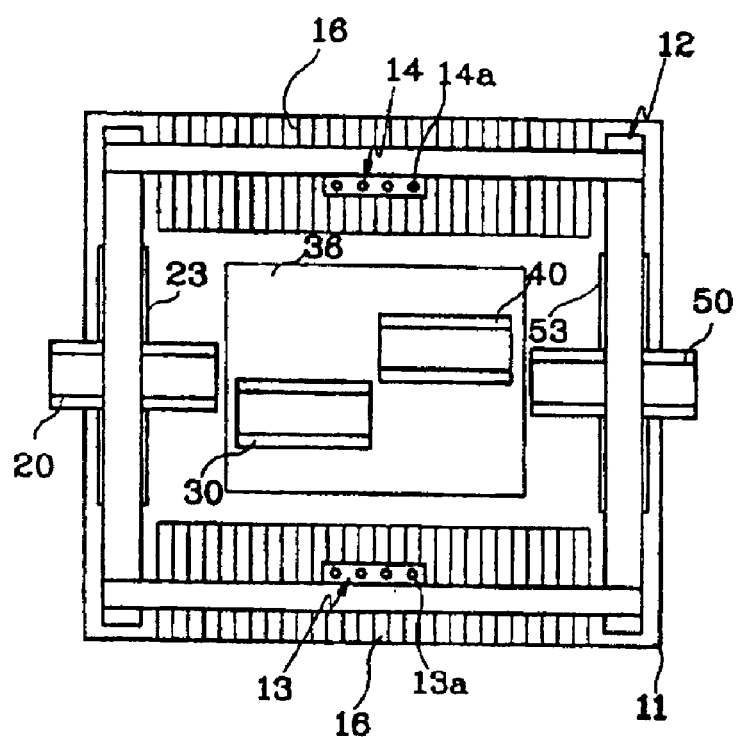
FIGS. 5a, 5b and 5c are plane views of the surface mounting device for showing a surface mounting method for carrying a printed circuit board using the surface mounting device according to the present invention.
Figure 5B:
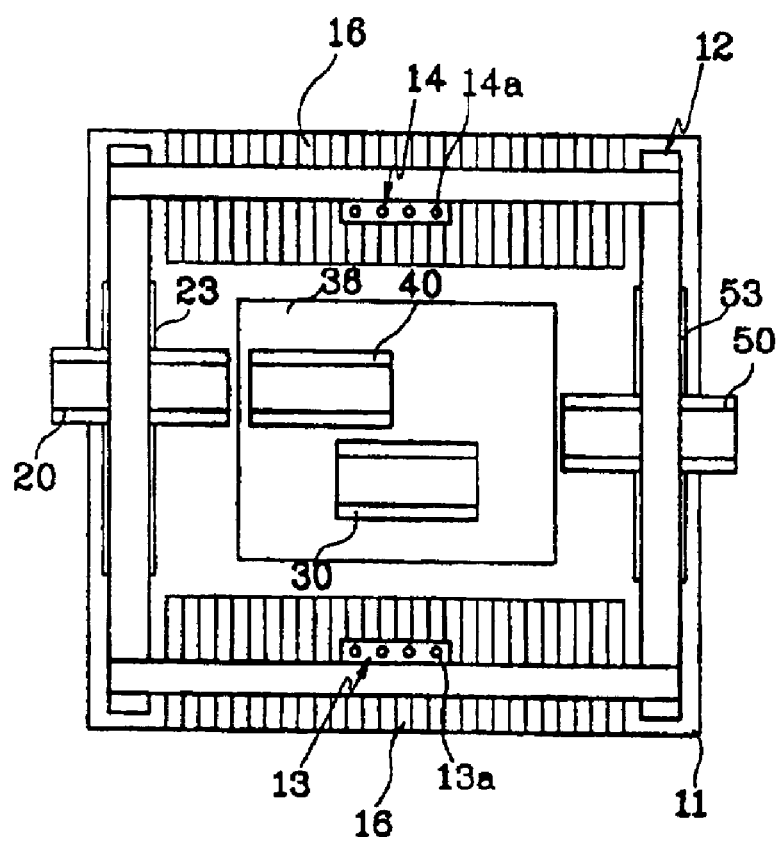
Figure 5C:
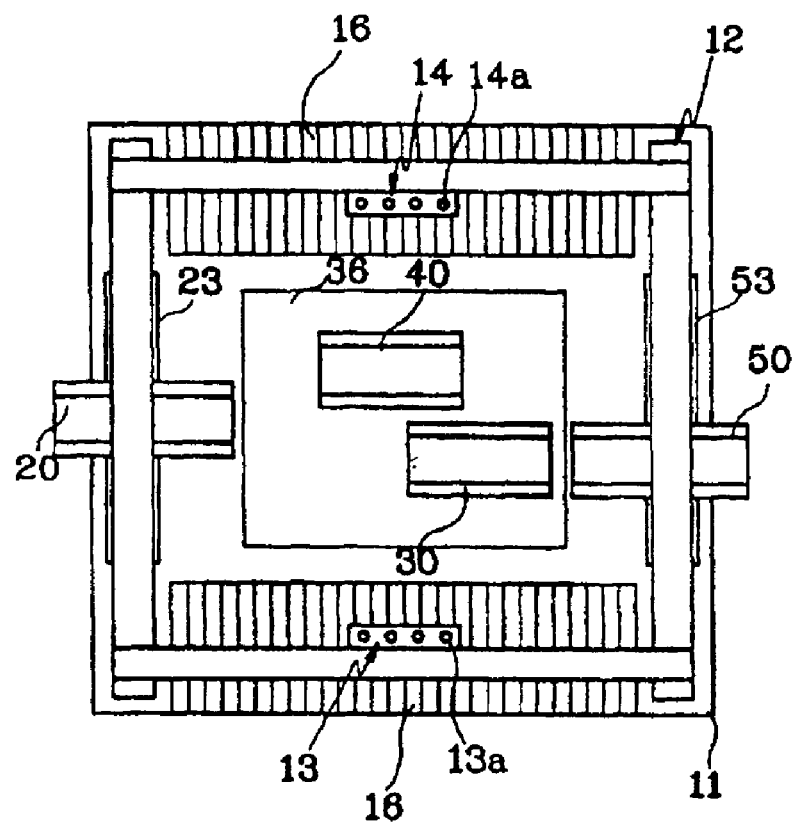

As described above, the first transfer 20, the first conveyer 30, the second conveyer 40 and the second transfer 50 are controlled by a controller 61 and a drive circuit 62 and are moved for carrying the printed circuit board 1 as illustrated in FIGS. 5a through 5c.

FIG. 5a shows a state in which the first conveyer 30 and the second conveyer 40 are moved to a position for mounting parts on the carried printed circuit board 1. In an surface mounting method of the present invention, as illustrated in FIG. 5a, the printed circuit board 1 is transferred to one conveyer 30 of the plurality of conveyers 30 and 40 movable from the first transfer 20 in a predetermined direction. In addition, the printed circuit board 1 is transferred to the other conveyer 40 of the plurality of conveyers 30 and 40. While electronic parts from the parts feeder 16 are mounted onto the transferred printed circuit board 1, the printed circuit board 1 is transferred to one of the plurality of conveyers 30 and 40. Then, while the printed circuit board 1 onto which the parts have been mounted is transferred to the second transfer 50, the electronic parts from the parts feeder 16 are mounted again onto the transferred printed circuit board 1. In addition, while a new printed circuit board is transferred to one conveyer 30 of the plurality of conveyers 30 and 40 from the first transfer 20, the printed circuit board 1 onto which the parts have been mounted is transferred again to the second transfer 50.

FIG. 5b shows another surface mounting method according to the present invention. In the surface mounting method of the present invention, as illustrated in FIG. 5b, the printed circuit board 1 is transferred sequentially to the plurality of conveyers 30 and 40 movable from the first transfer 20 in a predetermined direction. The printed circuit board 1 transferred firstly and placed on one of the plurality of conveyers 30 and 40 is moved to a predetermined position for thereby mounting electronic parts. At the same time, the printed circuit board 1 transferred later and placed on the other one of the plurality of conveyers 30 and 40 is moved to a predetermined position. While the printed circuit board 1 onto which the parts have been mounted is transferred to the second transfer 50 movable in a predetermined direction, the electronic parts are mounted on the printed circuit board 1 moved to the predetermined position. Then, while a new printed circuit board is transferred to one conveyer of the plurality of conveyers 30 and 40 from the first transfer 20, the printed circuit board 1 onto which the parts have been mounted is transferred to the second transfer 50 movable in the predetermined direction.

FIG. 5c shows yet another surface mounting method according to the present invention, which illustrates a state in which the first conveyer 30 is moved to the second conveyer 40 to carry the printed circuit board 1 directly to the second transfer 50 and at the same time the second conveyer 40 is moved to a parts mounting work position.

In yet another surface mounting method of the present invention, as illustrated in FIG. 5c, the first transfer 20 is moved to a position where the plurality of conveyers 30 and 40 each are positioned to move the printed circuit board 1 sequentially. Then, the plurality of conveyers 30 and 40 having the printed circuit board placed thereon is moved to a predetermined position for thereby mounting parts from a plurality of parts feeder. In addition, as the conveyer having the printed circuit board 1 onto which the parts have been mounted placed thereon is moved in a predetermined direction, it is moved to a predetermined position of the second transfer 50, for thereby reducing a movement length when carrying the printed circuit board.

As seen from above, parts can be mounted on a plurality of printed circuit boards simultaneously by having a plurality of conveyers carrying the printed circuit board, moving the first and second conveyers freely in the X-Y axis direction and moving the first and second transfers in the Y-axis direction.

As explained above, the surface mounting device capable of simultaneous process on a plurality of printed circuit boards according to the present invention provides an effect of improving the productivity of a parts mounting work by simultaneously mounting parts on a plurality of printed circuit boards by moving the first and second conveyers freely in the X-Y axis direction and moving the first and second transfers in the Y-axis direction.

What is claimed is:

1. A surface mounting device including an X-Y gantry mounted on a base frame, a plurality of head units mounted on predetermined positions of the X-Y gantry, a parts feeder for supplying parts to be mounted on a printed circuit board carried to a parts mounting work position, the surface mounting device comprising:
   a plurality of transfers movably mounted on opposite sides of the base frame;
   a driving means for moving the plurality of transfers;
   a plurality of movable conveyers that are movable in X and Y directions mounted between the plurality of transfers; and
   a plane power transmission device for generating a driving force for moving the plurality of conveyers in X and Y directions.

2. The surface mounting device of claim 1, wherein the plurality of transfers comprises first and second transfers and the first and the second transfers each comprise:
   a transfer base frame for guiding a printed circuit board;
   first and second transfer rollers mounted on the base frame;
   a member mounted on the first and the second transfer rollers.

3. The surface mounting device of claim 1, wherein the driving means is a moving magnet type linear motor.

4. The surface mounting device of claim 1, wherein the driving means is a moving coil type linear motor.

5. The surface mounting device of claim 1, wherein the driving means is any one among a ball screw, a belt type power transmission means, and a linear power transmission means.

6. The surface mounting device of claim 1, wherein the plurality of conveyers comprises first and second conveyers, and wherein the first and second conveyers each comprise:
   a conveyer base frame;
   a transfer roller configured to be rotated for transferring a printed circuit board carried by one of the plurality of transfers to a parts mounting work position;
   a lifting member for lifting the printed circuit board to a predetermined height and then lowering the printed circuit board when the mounting of parts is finished; and
   a discharging roller for discharging the printed circuit board to one of the plurality of transfers.

7. The surface mounting device of claim 6, wherein a plane mover is mounted to a lower portion of each of the plurality of movable conveyers.

8. The surface mounting device of claim 1, wherein the plurality of conveyers each further comprise a controller connected to a drive circuit for moving the printed circuit board with various speeds.

9. The surface mounting device of claim 7, wherein the plane power transmission device comprises a plane stator frame, and the plane movers of the plurality of conveyers are moved over an upper portion of the plane stator frame.

10. A surface mounting device, comprising:
    an X-Y gantry mounted on a base frame;
    at least one parts mounting head coupled to the X-Y gantry;
    at least one transfer that is movably mounted on the base frame, wherein each transfer is configured to transfer circuit boards; and
    at least one conveyer movably mounted on the base frame, wherein each conveyer is configured to hold and move a circuit board, and wherein each conveyer is configured move in X and Y directions to move a circuit board to a plurality of different parts mounting positions.

11. The surface mounting device of claim 10, wherein each conveyer is also configured to receive a circuit board from a transfer, and to discharge a circuit board to a transfer.

12. The surface mounting device of claim 10, wherein each transfer is configured to move in a predetermined direction to align with conveyers located at different positions on the base frame.

13. The surface mounting device of claim 10, wherein each transfer is configured to move in a predetermined direction to thereby align with either of two conveyers that are positioned side-by-side on the base frame.

14. The surface mounting device of claim 10, further comprising at least one transfer driver configured to move the at least one transfer.

15. The surface mounting device of claim 14, wherein the at least one transfer driver is selected from the group consisting of a ball screw driver, a belt type driver, and a linear motor.

16. The surface mounting device of claim 10, further comprising at least one conveyer driver configured to move the at least one conveyer in X and Y directions.

17. The surface mounting device of claim 16, wherein the at least one conveyer driver comprises a plane power transmission device.

18. The surface mounting device of claim 17, wherein the plane power transmission device comprises:
    a plane stator mounted on the base frame; and
    a mover coupled to a bottom of each at least one conveyer, wherein each mover is configured to interact with the plane stator to generate a force that moves the at least one conveyer in X and Y directions.

19. The surface mounting device of claim 10, wherein the at least one transfer comprises first and second transfers mounted on opposite side of the base frame, and wherein the at least one conveyer comprises a plurality of conveyers that are independently movable in X and Y directions.

20. The surface mounting device of claim 19, further comprising a plane power transmission device configured to move the plurality of conveyers, wherein the plane power transmission device comprises:
    a plane stator mounted on the base frame; and
    a mover coupled to a bottom of each of the plurality of conveyers, wherein each mover is configured to interact with the plane stator to generate a force that moves the conveyer in X and Y directions.

21. The surface mounting device of claim 20, wherein the first and second transfers are configured to that they can move to align with conveyers located at a plurality of different positions on the base frame.

* * * * *